United States Patent
Ogasawara et al.

(10) Patent No.: US 6,637,445 B2
(45) Date of Patent: Oct. 28, 2003

(54) SUBSTRATE PROCESSING UNIT

(75) Inventors: Kazuhisa Ogasawara, Katano (JP); Katsuyoshi Nakatsukasa, Asakuchi-gun (JP); Hirohumi Shoumori, Kurashiki (JP); Kenji Otokuni, Higashiyamato (JP); Kazutoshi Watanabe, Iruma-gun (JP); Hiroki Takahashi, Inashiki-gun (JP)

(73) Assignees: S.E.S. Company Limited, Tokyo (JP); Omege Semiconductor Electronics Co., Ltd., Tokyo (JP)

( * ) Notice: Subject to any disclaimer, the term of this patent is extended or adjusted under 35 U.S.C. 154(b) by 217 days.

(21) Appl. No.: 09/940,859

(22) Filed: Aug. 29, 2001

(65) Prior Publication Data
US 2002/0108642 A1 Aug. 15, 2002

(30) Foreign Application Priority Data
Dec. 12, 2000 (JP) ........................... 2000-377785

(51) Int. Cl.$^7$ ................................. B09B 3/10
(52) U.S. Cl. ................. 134/99.1; 134/105; 134/108; 134/902
(58) Field of Search ............... 134/94.1, 95.1, 134/99.1, 105, 108, 902

(56) References Cited

U.S. PATENT DOCUMENTS

| 4,746,397 A | * | 5/1988 | Maeda et al. |
| 5,078,832 A | * | 1/1992 | Tanaka |
| 5,129,955 A | * | 7/1992 | Tanaka |
| 5,489,557 A | * | 2/1996 | Jolley |
| 5,569,330 A | * | 10/1996 | Schild et al. |
| 5,714,203 A | * | 2/1998 | Schellenberger et al. |
| 5,772,784 A | * | 6/1998 | Mohindra et al. |
| 5,795,494 A | * | 8/1998 | Hayami et al. |
| 6,058,945 A | * | 5/2000 | Fuijyama et al. |

FOREIGN PATENT DOCUMENTS

| JP | 40122024 | * | 4/1992 |
| JP | 6-310484 | * | 6/1994 |
| JP | 11-67713 | * | 3/1999 |

* cited by examiner

Primary Examiner—Frankie L. Stinson
(74) Attorney, Agent, or Firm—Armstrong, Westerman & Hattori, LLP

(57) ABSTRACT

A substrate processing unit 10 capable of restraining contaminants such as particles, watermarks and the like from being adhered to a substrate such as a semiconductor wafer and the like, wherein the substrate processing unit 10 comprises a processing bath 11 for accommodating the substrates (e.g., wafer W) to be processed, a processing fluid introduction pipe 21 for supplying processing fluid (e.g., purified water J) to the processing bath 11, a vapor generating bath 61 for accommodating an organic solvent S (e.g., IPA fluid), a processing fluid discharge section 30 for discharging processing fluid from the processing bath 11, and a solvent heating unit 62 for heating the organic solvent S inside the vapor generating bath 61, wherein the vapor generating bath 61 introduces vapor generated from the organic solvent S to the inside of the processing bath 11, and the solvent heating unit 62 heats the organic solvent S inside the vapor generating bath 61 at a temperature in the range of 50° C.±5° C. if a surface of the wafer W is hydrophobic and heats the organic solvent S at a temperature in the range of 70° C.±5° C. if the surface of the wafer W is hydrophilic.

9 Claims, 3 Drawing Sheets

SUBSTRATE PROCESSING UNIT

BACKGROUND OF THE INVENTION

1. Field of the Invention

The invention relates to a substrate processing unit for processing, for example, a semiconductor wafer, a substrate for use in liquid crystal display, a substrate for use in a storage disc, a substrate for use in a mask and such other substrates.

2. Description of the Prior Art

In a method of fabricating a semiconductor, a wafer is processed by utilizing a chemical fluid such as purified water in order to cleanse the surface of the wafer. For example, Japanese Patent Publication No. 6-103686 discloses a surface dry processing method including a process of supplying dry vapor to form a fluid layer of a dry fluid over a cleaning fluid, and a process of replacing the cleaning fluid with a fluid layer by directly replacing the cleaning fluid with dry fluid from the surface of a material to be dried such as a wafer, wherein the surface of the material to be dried is substantially of the same temperature as that of the vapor when contacting the vapor, and the replacement of the cleaning fluid by the dry fluid is sufficiently slow in the manner that fluid droplets do not remain on the material to be dried so that no part of the cleaning fluid or dry fluid which would have been removed by the vaporization of the fluid droplets substantially remains.

Meanwhile, Japanese Patent No. 3,009,699 discloses a method of processing a surface of a substrate (hereinafter referred to as "Substrate Surface") for separating fluid from a substrate such as a semiconductor wafer and the like after the substrate is immersed in a fluid bath, and allowing the fluid and the substrate surface to directly contact the vapor of an organic compound while the substrate is separated from the fluid. This method has a vapor pressure under which an organic compound vapor is not saturated at the temperature of the substrate, and the vapor is not condensed on the substrate during the separation of the substrate from the fluid, wherein the organic compound is soluble in the fluid and is selected from a group of organic compounds which lower the surface tension when they are soluble in the fluid. The vapor pressure of the organic compound, solubility of the organic compound relative to the fluid, and the speed of separation of the substrate from the fluid are selected to have a direction and magnitude such that no part of the fluid substantially remains on the substrate during the separation of the substrate from the fluid and an inclination is provided on the surface tension of the fluid when the substrate crosses the surface of the fluid.

The applicant of the present application has developed and proposed many methods of processing a semiconductor wafer and the like, and has obtained letters patent such as those disclosed in Japanese Patent No. 3,017,033, U.S. Pat. No. 5,951,779 and Japanese Application No. 11-183469.

Japanese Patent No. 3,017,033 discloses a method of processing or a series of processes whereby a material in a sealed container is to be dried from a cleaning process to a drying process, wherein processing from the final cleaning to steam drying can be carried out in one container, and the organic solvent is vaporized at a low temperature in the range of 35° C. to 60° C. and the material is dried by the vapor thus generated.

Japanese Patent No. 5,951,779 discloses a method of processing or a series of processes whereby a material in a sealed container is to be dried through a steam drying process following a cleaning process, in the manner stated below.

That is, the method includes (1) a step of supplying hot purified water to the inner sides of a container in which the material to be dried is accommodated; (2) a step of supplying organic solvent steam to the space above the hot purified water in the container after the final cleaning processing is carried out; (3) a step of continuously supplying an inert gas from the upper side of the container while sucking and discharging the hot purified water from the bottom side of the container after the supply of the organic solvent is stopped; and (4) a step of continuously sucking the hot purified water to depressurize the container so as to dry the material to be dried after the completion of sucking and discharging the hot purified water, wherein a degree of depressurization of the container is controlled and maintained at a predetermined set value to subject the material to be dried to dry processing until the sucking and discharging of the hot purified water is completed at least in the step of sucking and discharging the hot purified water from the bottom side of the container, particularly controlled and maintained at a temperature in the range of 30° C. to 65° C., and set at −350 to −150 mmHg in terms of degree of depressurization.

Further, Japanese Application No 11-183469 discloses (1) a surface dry processing method for drying a material such as a wafer and the like, by heating an organic solvent at a temperature of 60° C. to 80° C. and applying the heated organic solvent to a fluid surface, thereby forming a film including the organic solvent on the processed fluid surface by means of a drying bath for accommodating the wafer therein; (2) a processing fluid supply means for supplying processing fluid to the inside of the drying bath, (3) an organic solvent supply means for supplying a heated organic solvent in the drying bath; and (4) a vapor supply means for supplying vapor containing an organic solvent.

In the surface drying processing method particularly disclosed in Japanese Patent No. 3,017,033 and Japanese Application No. 11-183469, the surface of a wafer and the like is cleaned by a chemical fluid, rinsed by a processing fluid such as purified water and then dried by an organic solvent such as isopropyl alcohol (hereinafter referred to as "IPA").

For example, when the wafer is exposed to a vapor of IPA after the wafer is cleaned by purified water, the IPA is condensed on the surface of the wafer. When the IPA is condensed, the purified water that has adhered to the wafer is replaced by the IPA, and contaminants such as particles and the like are washed out as the purified water runs from the surface of the wafer. Thereafter, when the IPA is vaporized, the surface of the wafer is dried. If a water droplet remains on the substrate surface during the drying process, an oxide film (hereinafter referred to as "Watermark") is formed on the substrate surface. Since the watermark causes the quality of the substrate to deteriorate, it is desirable to prevent as much as possible the adhesion of contaminants onto the substrate.

If a substrate (e.g., wafer) is processed by a chemical fluid, the surface condition of the substrate varies depending on the kind of processing applied. For example, the surface of a semiconductor wafer, becomes hydrophobic when processed by, e.g., hydrofluoric acid chemical fluid, and becomes hydrophilic when processed by a fluid other than hydrofluoric acid chemical fluid. In a conventional substrate processing unit, vapor is generated in the same condition irrespective of whether the substrate surface is hydrophobic or hydrophilic. However, according to the research of the inventors of the present application, the amount of contaminants that remain on the substrate after drying where the substrate surface is hydrophobic differs from such amount where the substrate surface is hydrophilic. The inventors have also ascertained that the amount of contaminants that adhere to the substrate is correlated with the amount of production of organic solvent vapor.

SUMMARY OF THE INVENTION

The object of the invention is to provide a substrate processing unit capable of reducing contaminants that adhere to a substrate surface as much as possible.

To achieve this, the substrate processing unit of the invention comprises (1) a processing bath for accommodating substrates to be processed; (2) a processing fluid supply means for supplying a processing fluid to the processing bath; (3) a vapor generating bath for accommodating an organic solvent and introducing the vapor generated from the organic solvent into the processing bath; (4) a processing fluid discharge means for discharging the processing fluid from the processing bath; and (5) a solvent heating unit for heating the organic solvent in the vapor generating bath, wherein the solvent heating unit heats the organic solvent at an initial temperature when the surface of each substrate accommodated in the processing bath is hydrophobic, and heats the organic solvent at a higher temperature when the substrate surface is hydrophilic.

According to the invention, when the substrate surface is hydrophobic, the organic solvent in the vapor generating bath is heated at an initial temperature. If the substrate surface is hydrophilic, the organic solvent in the vapor generating bath is heated at a relatively higher temperature. An organic solvent vapor is generated by supplying inert gas to the vapor generating bath, and it is introduced in the processing bath. The organic solvent heated at the higher temperature generates more vapor than organic solvent heated at the initial temperature. When the vapor is condensed on the substrate surface, a processing fluid (e.g., purified water) which has adhered to the substrate so far is replaced by the organic solvent, and the processing fluid runs from the substrate surface and accordingly, contaminants such as particles and the like are washed out. Thereafter, when the organic solvent is vaporized, the substrate surface is dried.

An example of the processing fluid is represented by purified water, and an example of the organic solvent is isopropyl alcohol. In this case, it is preferable that the initial temperature be in the range of 50° C.±5° C. and the second temperature be in the range of 70° C.±5° C.

The substrate processing unit of the invention may be provided with a first solvent heating bath for accommodating an organic solvent which is heated at the initial temperature, a second solvent heating bath for accommodating an organic solvent which is heated at the second temperature, a piping for connecting the first and second solvent heating baths and the vapor generating bath, and switching means provided on the piping for allowing the first solvent heating bath to communicate with the vapor generating bath where the surface of the substrate accommodated in the processing bath is hydrophobic, and for allowing the second solvent heating bath to communicate with the vapor generating bath where the surface of the substrate accommodated in the processing bath is hydrophilic.

Further, the substrate processing unit of the invention may be provided with inert gas supply means for supplying a first amount of inert gas for bubbling to the organic solvent in the vapor generating bath when the substrate surface is hydrophobic, and for supplying a second amount of inert gas for bubbling to the organic solvent in the vapor generating bath when the substrate surface is hydrophilic, wherein the second amount is larger than the first.

According to the invention, it is possible to prevent contaminants such as particles, watermarks and the like from being adhered to the substrate surface by controlling the amount of organic solvent vapor produced in response to a surface condition of the substrate, thereby obtaining a high quality substrate. Further, it is possible to prevent contaminants from being adhered to the substrate surface in response to the surface condition of the substrate, thereby obtaining a high quality substrate when drying the substrate which is cleaned by purified water through the use of IPA.

In addition, it is possible to prevent contaminants from being adhered to the substrate surface even under any condition of the substrate surface by keeping an IPA fluid in the vapor generating bath at a temperature in the range of 50° C.±5° C. when the substrate surface is hydrophobic while keeping the IPA fluid at a temperature in the range of 70° C.±5° C. when the substrate surface is hydrophilic. It is also possible to quickly supply the organic solvent at a temperature corresponding to the surface condition of the substrate to the vapor generating bath.

Moreover, it is possible to prevent contaminants from being adhered to the substrate surface by controlling the amount of production of the organic solvent vapor in response to the substrate surface condition, thereby obtaining a high quality substrate by supplying the processing bath with a desired chemical fluid suitable for processing the substrate.

Further, it is possible to continuously wash out contaminants, particles and the like inside the inner bath of the substrate processing unit by allowing the processing fluid supplied from the inner bath to flow into the outer bath to discharge the processing fluid from the outer bath.

DETAILED DESCRIPTION OF THE PREFERRED EMBODIMENTS

Figure 1:
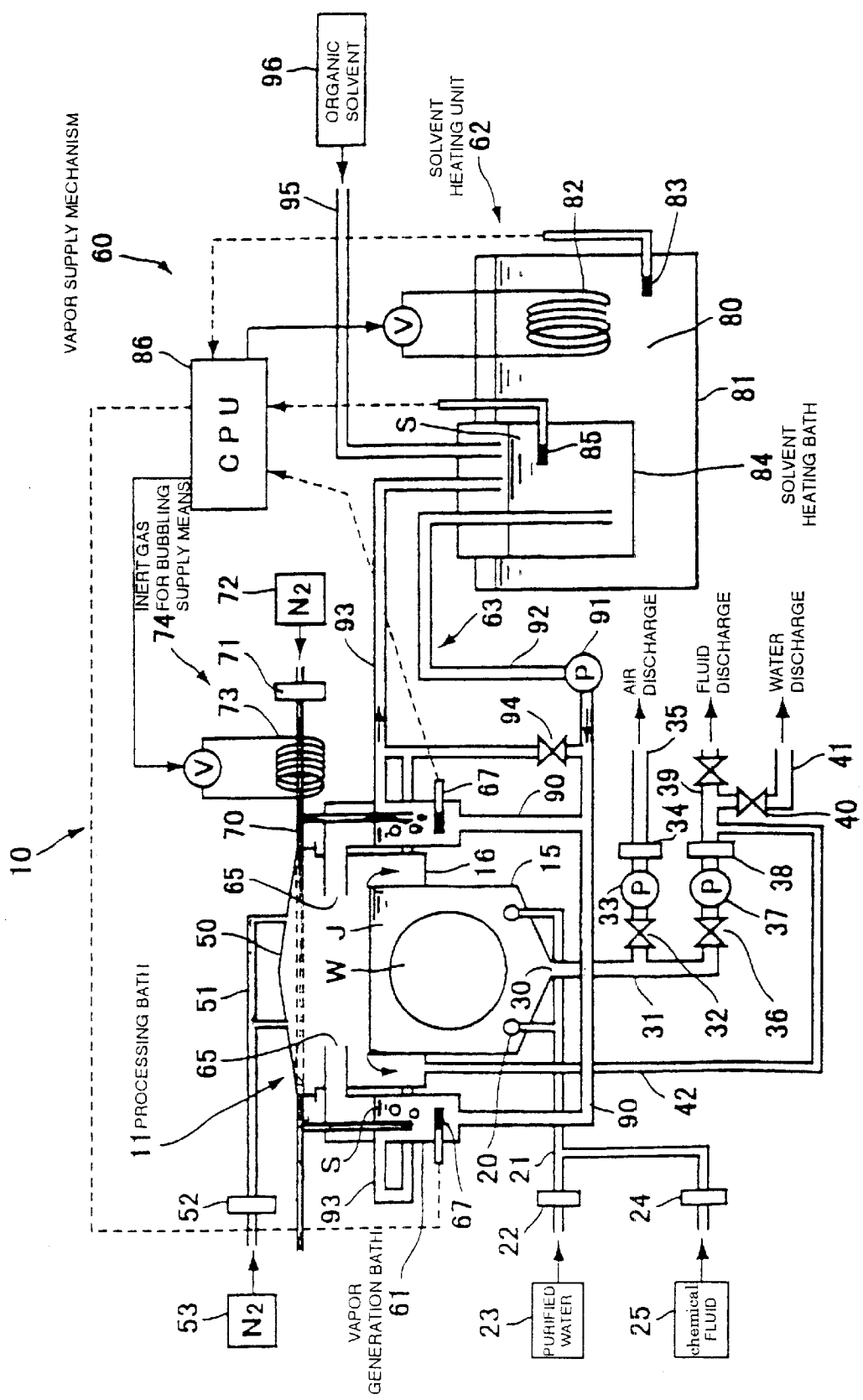
FIG. 1 is a sectional view typically showing a substrate processing unit according to the first embodiment of the invention.

First Embodiment (FIGS. 1 and 2):

A substrate processing unit 10 according to the first embodiment of the invention is hereafter described with reference to FIGS. 1 and 2. The substrate processing unit 10 shown in FIG. 1 is a facility for processing a semiconductor wafer W as an example of a substrate. Processing consists of the following steps: first, a semiconductor wafer W is etched by a chemical fluid; secondly, the surface of the semiconductor wafer W is subjected to hydrofluoric acid treatment: thirdly, the semiconductor wafer W is rinsed; and finally, the semiconductor wafer W is dried through the use of an organic solvent. These steps are sequentially performed using a processing bath 11, described below. An example of an organic solvent is isopropyl alcohol (IPA).

The processing bath 11 comprises an inner bath 15 with an open upper surface and a box-shaped bottom, and an outer bath 16 which surrounds the upper outer periphery of the inner bath 15. Processing fluid supply sections 20 are provided on the bottom of the inner bath 15. The processing fluid supply sections 20 are connected to a processing fluid introduction pipe 21. The processing fluid supply sections 20 and the processing fluid introduction pipe 21 constitute processing fluid supply means.

The processing fluid introduction pipe 21 is connected to a purified water supply source 23 by way of a flow rate control valve 22. A chemical fluid supply source 25 is connected to the processing fluid introduction pipe 21 by way of a flow rate control valve 24. The chemical fluid supply source 25 serving as processing fluid supply means is provided with chemical fluid preparation means for preparing a desired chemical fluid of a given concentration and a given temperature. The chemical fluid is selected from hydrofluoric acid, hydrochloric acid, hydrogen peroxide fluid, sulfuric acid, ozonic water, ammonia water, alkaline detergent, surface active agent, amine organic solvent, fluorine organic solvent, or electrolytic ionic water depending on the purpose of processing (e.g., cleaning, etching, oxidation and the like), and it may be a combination or a plurality of these chemical fluids, if need be.

A processing fluid discharge section 30 is provided in the inner bath 15 at the lowest position. An inner bath waste fluid pipe 31 is connected to the processing fluid discharge section 30. The processing fluid discharge section 30 and the inner bath waste fluid pipe 31 constitute processing fluid discharge means used here. A closing valve 32, a pump 33 and an air release pipe 35 provided with a flow rate control valve 34 are respectively connected to the inner bath waste fluid pipe 31. Further, a fluid discharge pipe 39 provided with a closing valve 36, a pump 37 and a flow rate control valve 38 is connected to the inner bath waste fluid pipe 31. Further still, a discharge pipe 41 provided with a closing valve 40 is connected to the fluid discharge pipe 39.

The outer bath 16 serves as an overflow bath for receiving processed fluid which flows to the upper portion of the inner bath 15. A drainpipe 42 is connected to the outer bath 16 at the lowest position. The other end of the drainpipe 42 is connected to the fluid discharge pipe 39. Both the inner bath 15 and the outer bath 16 are made of a material (e.g., poly vinylidene fluoride) which is not susceptible to corrosion by an organic solvent such as hydrofluoric acid and IPA.

A closable lid 50 is provided on the upper portion of the outer bath 16. An inert gas supply pipe 51 is connected to the lid 50. The inert gas supply pipe 51 is connected to an inert gas supply source 53 by way of a flow rate control valve 52 so as to supply an inert gas such as nitrogen gas, which has a room temperature or is heated, to the processing bath 11 from the upper portion of the processing bath 11.

A vapor supply mechanism 60 is provided in the vicinity of the processing bath 11. The vapor supply mechanism 60 comprises a vapor generating bath 61, which is disposed in the vicinity of the outer bath 16, a solvent heating unit 62 for heating an organic solvent and a piping 63 for connecting the vapor generating bath 61 to the solvent heating unit 62.

Vapor discharge ports 65 which lie over the inner bath 15, and a temperature sensor 67 for detecting the temperature of the organic solvent (IPA fluid) S inside the vapor generating bath 61 are respectively provided in the vapor generating bath 61. An inert gas supply pipe 70 for the purpose of bubbling is connected to the vapor generating bath 61. The inert gas supply pipe 70 is connected to an inert gas supply source 72 by way of a flow rate control valve 71 for supplying an inert gas such as a nitrogen gas, which has a room temperature or is heated, to the inside of the vapor generating bath 61. A heater 73 is provided midway to the inert gas supply pipe 70. The heater 73 can heat the inert gas which is supplied from the vapor generating bath 61 through the inert gas supply pipe 70, in response to the temperature of the organic solvent S.

The inert gas supply pipe 70, the flow rate control valve 71, the inert gas supply source 72, the heater 73 and the like constitute the inert gas supply means 74 used here. The inert gas supply means 74 supplies an initial amount of inert gas for bubbling to the organic solvent S inside the vapor generating bath 61 when the surface of the wafer W is hydrophobic while supplying a second inert gas for bubbling, which amount is larger than the first, when the surface of the wafer W is hydrophilic.

The solvent heating unit 62 comprises a bath 81 for reserving heating medium 80 such as purified water and the like, a heater 82 for heating the heating medium 80, a first temperature sensor 83 for detecting the temperature of the heating medium 80, a solvent heating bath (IPA bath) 84 provided inside the bath 81, and a second temperature sensor 85 for detecting the temperature of IPA reserved in the solvent heating bath 84.

Temperature values detected by the temperature sensors 67, 83 and 85 are respectively inputted to a CPU (control processing unit) 86 provided with operation means such as a microcomputer and the like. The CPU 86 controls the heating value of the heater 82 on the basis of temperature values detected by the temperature sensors 67, 83 and 85 so as to heat the organic solvent S inside the vapor generating bath 61 at a desired temperature corresponding to the surface condition of the wafer W, such as an initial temperature (50° C.±5° C.) and a higher temperature (70° C.±5° C.), as described below.

The piping 63 comprises an organic solvent supply and drain pipe 90 connected to the bottom of the vapor generating bath 61, an organic supply pipe 92 connected to the organic solvent supply and drain pipe 90 by way of a pump 91, and an organic solvent return pipe 93 connected to the upper portion of the vapor generating bath 61 and the like. The organic supply pipe 92 communicates with the solvent heating bath 84 so as to transport the organic solvent S inside the solvent heating bath 84 to the vapor generating bath 61 by way of the pump 91. The organic solvent return pipe 93 transports the organic solvent S, which flows to the upper portion of the vapor generating bath 61, and to the solvent heating bath 84. A waste fluid valve 94 is provided on the organic solvent supply and drain pipe 90 which may be opened in order to discharge the organic solvent S inside the vapor generating bath 61. An organic solvent supply source 96 is connected to the solvent heating bath 84 by way of an organic solvent replenishing pipe 95. Although the organic solvent return pipe 93 appears to be provided over the waste fluid valve 94 for the convenience of illustration in FIG. 1, the former is positioned under the latter in an actual substrate processing unit.

Described next is a function of the substrate processing unit 10.

When the wafer W serving as an example of a substrate is processed by a chemical fluid, a desired chemical fluid is supplied from the chemical fluid supply source 25 to the inner bath 15 through the processing fluid introduction pipe 21 and the processing fluid supply sections 20. When the wafer W is immersed in the chemical fluid for a given period of time, the wafer W is subjected to various processes (e.g., etching, fluoride acid processing, cleaning, and the like), in response to the chemical fluid.

Upon completion of the chemical fluid processing for a given period of time, purified water J supplied from the purified water supply source 23 is supplied to the inner bath 15 through the processing fluid introduction pipe 21 and the processing fluid supply sections 20. The purified water J flows to the upper portion of the inner bath 15 into the outer bath 16 while pressing out the residual chemical fluid inside the inner bath 15, and is then discharged from the discharge pipe 41 through the drain pipe 42. When the purified water J is continuously supplied to the inner bath 15 for a given period of time, the inner sides of the inner bath 15 is cleaned by fresh purified water and the inner bath 15 is continuously filled with the purified water J.

Figure 2:
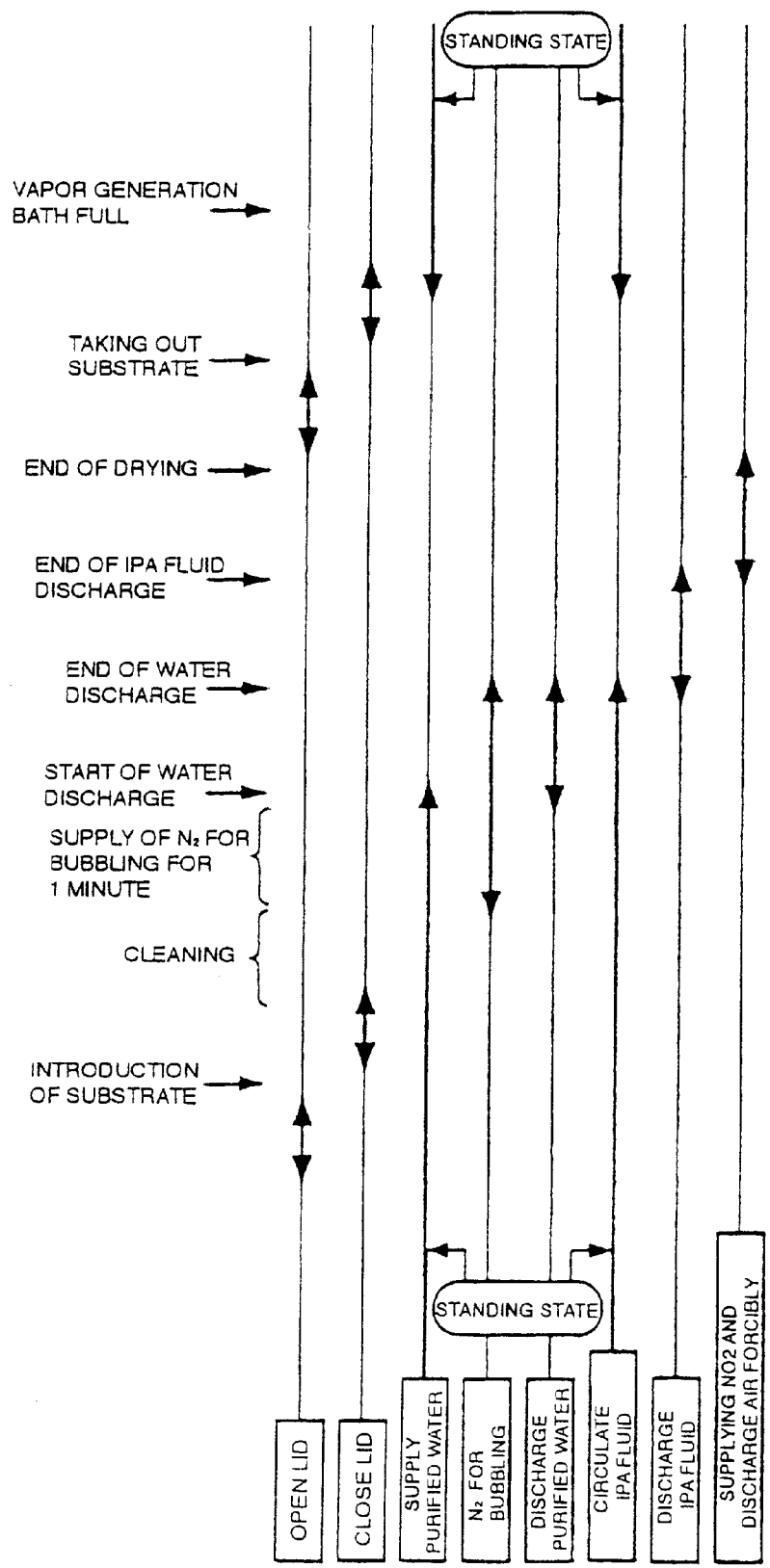
FIG. 2 is a time chart showing functions of the substrate processing unit shown in FIG. 1.

Described next with reference to a time chart in FIG. 2 is the process of subjecting the wafer W to cleaning, rinsing and drying steps through the use of the substrate processing unit 10.

Purified water J is supplied from the purified water supply source 23 to the inner bath 15 through the processing fluid introduction pipe 21 and the processing fluid supply sections 20, then flows to the inner bath 15, and is finally discharged by the drain pipe 41 through the flow rate control valve 22. In a standby state, such fresh purified water J is continuously supplied to the inner bath 15.

Meanwhile, the vapor supply mechanism 60 supplies the organic solvent S inside the solvent heating bath 84 to the vapor generating bath 61 by way of the organic supply pipe 92 so that the organic solvent S inside the vapor generating bath 61 has a temperature corresponding to the surface condition of the wafer W. The overflowing excess organic solvent S supplied to the inside of the vapor generating bath 61 is transported back to the solvent heating bath 84 through the organic solvent return pipe 93. When the organic solvent S is circulated between the vapor generating bath 61 and the solvent heating bath 84 in such manner, the organic solvent S inside the vapor generating bath 61 is kept at a constant temperature.

For example, if the surface of the wafer W is hydrophobic, the organic solvent S, which is heated at the initial temperature (in the range of 50° C.±5° C.), is supplied to the vapor generating bath 61 for the reason stated below. If the surface of the wafer W is hydrophilic, the organic solvent S, which is heated at a higher temperature (in the range of 70° C.±5° C.), is supplied to the vapor generating bath 61.

The lid 50 of the processing bath 11 is opened to introduce the wafer W into the purified water J inside the inner bath 15, and then the lid 50 is closed. At about the same time, an inert gas such as nitrogen and the like is supplied from the inert gas supply pipe 51 to the inside of the processing bath 11. After air inside the processing bath 11 is replaced by the inert gas, the supply of the inert gas is stopped.

When the cleaning and rinsing of the wafer W is completed in accordance with the processing procedure stored in the CPU 86, the inert gas for bubbling such as nitrogen gas and the like is supplied from the inert gas supply pipe 70 to the inside of the vapor generating bath 61. The inert gas supplied to the vapor generating bath 61 is regulated by the heater 73 at a temperature corresponding to the organic solvent S inside the vapor generating bath 61. Vapor of the organic solvent S is generated in the vapor generating bath 61 when the inert gas is made to bubble (e.g., for one minute). The vapor thus generated is introduced from the vapor discharge port 65 into the processing bath 11, and the space over the purified water J is filled with this vapor.

The inert gas supply means 74 supplies the first amount of inert gas for bubbling to the vapor generating bath 61 if the wafer W is hydrophobic and it may supply the second amount of inert gas for bubbling, which may be smaller than the first, to the vapor generating bath 61, if the wafer W is hydrophilic. When the amount of inert gas is modified in response to the surface condition of wafer W in such manner, the amount of vapor generated when a hydrophilic wafer W is processed becomes larger than that when a hydrophobic wafer W is processed.

The process then moves to the next drain step, where the closing valve 36 of the inner bath waste fluid pipe 31 is opened to discharge the purified water J inside the inner bath 15 little by little by using the flow rate control valve 38. As the purified water J is discharged, the fluid surface of the purified water J is lowered so that the wafer W is gradually exposed to the fluid surface from the upper end thereof.

As the surface of the wafer W is exposed to the fluid surface, the organic solvent vapor inside the processing bath 11 causes the surface of the wafer W to merge with the fluid surface. Since the temperature of the purified water J inside the processing bath 11 is substantially the same as the room temperature, the temperature of the wafer W is also substantially similar to the room temperature. Accordingly, when the organic solvent vapor comes into contact with the wafer W, it is cooled immediately, so that the organic solvent vapor is condensed on the surface of the wafer W over the fluid surface, thereby forming an organic solvent film. When the organic solvent film is formed on the wafer W, the purified water J which has adhered to the wafer W so far is replaced by the organic solvent S, causing the removal of the organic solvent film from the surface of the wafer W.

After the purified water J inside the inner bath 15 is discharged, the supply of the inert gas to the vapor generating bath 61 and the bubbling of the inert gas in the vapor generating bath 61 are respectively stopped. Then, the organic solvent S inside the vapor generating bath 61 is returned to the solvent heating bath 84 through the organic solvent supply and drain pipe 90.

From here, the process moves to the air release step. In the air release step, the inert gas which is at room temperature or heated is continuously supplied from the inert gas supply pipe 51 to the processing bath 11, while vapor inside the processing bath 11 and gas including an organic solvent S which is exhaled from the surface of the wafer W is discharged to an air release processing facility (not shown) through the processing fluid discharge section 30 and the air release pipe 35.

Upon completion of the air release step for a given period of time, the lid 50 is opened and the wafer W is taken out from the processing bath 11. Thereafter, the purified water J is supplied to the inner bath 15 by the processing fluid introduction pipe 21. The purified water J supplied to the inner bath 15 flows to the upper end of the inner bath 15 and is discharged outside the processing bath 11 through the drain pipe 42. In such manner, fresh purified water J is always supplied to the inner bath 15, and the process reverts to the standby state.

Meanwhile, the vapor supply mechanism 60 supplies the organic solvent S, heated at a temperature corresponding to the surface condition of the wafer W, to the vapor generating bath 61, and transports the residual organic solvent S inside the vapor generating bath 61 to the solvent heating bath 84.

In FIG. 1, although the organic solvent return pipe 93 is positioned over the waste fluid valve 94 for convenience of illustration, the organic solvent return pipe 93 is positioned under the waste fluid valve 94 in an actual unit wherein the organic solvent S inside the vapor generating bath 61 is collected by the solvent heating bath 84 while passing through the organic solvent supply and drain pipe 90, the waste fluid valve 94 and the organic solvent return pipe 93, owing to its gravity. When the organic solvent S is circulated between the vapor generating bath 61 and solvent heating bath 84 in such manner, the organic solvent S inside the vapor generating bath 61 is maintained at a certain temperature.

The following Table 1 shows the results of tests conducted to investigate the residual amount of particles (not less than 0.16 μm) when 50 pieces of wafers W are cleaned with purified water J by batch processing using the substrate processing unit 10 set forth above, and thereafter dried. The 50 pieces of wafers W were vertically arranged in the inner bath 15 parallel with one another at given pitches supported by a holder. The amount of nitrogen gas for bubbling supplied from the inert gas supply pipe 70 to the vapor generating bath 61 was set at 10 liters per minute.

In Table 1, No. 1 refers to a wafer positioned at the innermost part of the inner bath 15, No. 2 refers to a wafer positioned right at the center of the inner bath 15, and No. 3 refers to a wafer positioned nearest to a side of the inner bath 15. The number of particles per wafer before cleaning ranged from 10 to 30 pieces.

TABLE 1

| | Surface is hydrophilic Number of Particles (variable from upper limit to lower limit) | Surface is hydrophobic Number of Particles (variable from upper limit to lower limit) |
| --- | --- | --- |
| Temperature of IPA in the vapor generating bath ranges from 70° C. to 75° C. | No. 1  −8 to −23 (−13 on average) | No. 1  +13 to +29 (+20 on average) |
| | No. 2  −8 to +3 (−3 on average) | No. 2  −8 to +18 (+13 on average) |
| | No. 3  0 to −3 (−2 on average) −6 on total average | No. 3  +10 to +21 (+17 on average) +17 on total average |
| Temperature of IPA in the vapor generating bath ranges from 50° C. to 55° C. | No. 1  +9 to +16 (+13 on average) | No. 1  −7 to 0 (−5 on average) |
| | No. 2  0 to +22 (+10 on average) | No. 2  −10 to −17 (−13 on average) |
| | No. 3  −4 to +23 (+7 on average) +10 on total average | No. 3  −6 to −19 (−12 on average) −10 on total average |

As shown in Table 1, the organic solvent S is heated at an initial temperature (50° C. to 55° C.) when the surface of the wafer W is hydrophobic and heated at a higher temperature (70° C. to 75° C.) when the surface of the wafer W is hydrophilic so that the amount of particles has been sharply reduced. That is, when the surface of the wafer W is hydrophobic, the amount of vapor generated is relatively smaller as when the surface of the wafer W is hydrophilic, such that the amount of vapor generated is larger so that the adhesion of contaminants can be efficiently reduced. If the initial temperature is in the range of 50° C.±5° C. and the second temperature is in the range of 70° C.±5° C., the same effect has been observed. It has also been observed that not only particles serving as foreign matter but water marks as well have the same effect as above stated.

Further, as shown in the following Table 2, even where an initial amount of inert gas for bubbling (e.g., 10 liters/min) is supplied to the organic solvent S in the vapor generating bath 61 by the inert gas supply means 74 when the wafer W is hydrophobic and a larger amount of inert gas for bubbling (e.g., 30 liters/min), is supplied to the organic solvent S, the amount of adhesion of the particles can be reduced. Temperature of the organic solvent S in the vapor generating bath 61 in Table 2 ranges from 50° C. to 55° C. whether the wafer W is hydrophobic or hydrophilic.

TABLE 2

| | Surface is hydrophilic Number of Particles (variable from upper limit to lower limit) | Surface is hydrophobic Number of Particles (variable from upper limit to lower limit) |
| --- | --- | --- |
| Amount of N₂ bubbles in the vapor generating bath (10 liters/min) | No. 1  +9 to +16 (+13 on average) | No. 1  −7 to 0 (−5 on average) |
| | No. 2  0 to +22 (+10 on average) | No. 2  −10 to −17 (−13 on average) |
| | No. 3  −4 to +23 (+7 on average) +10 on total average | No. 3  −6 to −19 (−12 on average) −10 on total average |
| Amount of N₂ bubbles in the vapor generating bath (30 liters/min) | No. 1  −23 to +9 (−7 on average) | No. 1  −3 to 10 (+4 on average) |
| | No. 2  −11 to +11 (−1 on average) | No. 2  +3 to +38 (+16 on average) |
| | No. 3  −18 to +2 (−1 on average) −3 on total average | No. 3  −17 to +45 (+11 on average) +10 on total average |

As shown in Table 2, the amount of bubbling of the inert gas is relatively large, i.e., 25±5 liters/min if the surface of the substrate (wafer W) is hydrophilic while the amount of bubbling of the inert gas is relatively small, i.e., 5±5 liters/min if the surface of the substrate (wafer W) is hydrophobic, thereby reducing the amount of adhesion of particles including watermarks.

Figure 3:
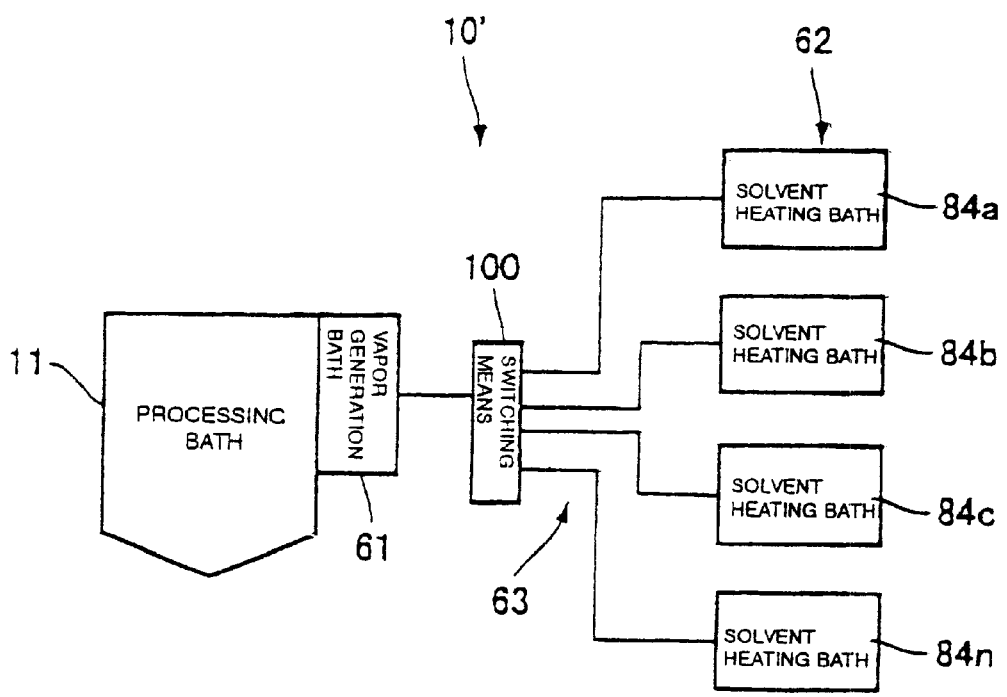
FIG. 3 is a side view typically showing a substrate processing unit according to the second embodiment of the invention.

FIG. 3 shows a substrate processing unit 10' according to the second embodiment of the invention. The substrate processing unit 10' comprises a plurality of solvent heating baths 84a, 84b, 84c, 84n for accommodating organic solvents which are differentiated from each other in terms of temperature, a piping 63 for connecting between respective solvent heating baths 84a to 84n and a vapor generating bath 61 and switching means 100 including, e.g., switching valve. An IPA fluid which is heated at an initial temperature (50° C.±5° C.) is accommodated in the first solvent heating bath 84a while the IPA fluid which is heated at a higher temperature (70° C.±5° C.) is accommodated in the second solvent heating bath 84b. Organic solvents having a temperature suitable for the surface condition of the substrate may be accommodated in additional solvent heating baths, 84c and 84n, other than the first and second solvent heating baths 84a and 84b.

The switching means 100 has a function to switch over passages extending from the solvent heating baths 84a, 84b, 84c and 84n to the vapor generating bath 61 so as to supply the organic solvent S having a temperature in response to the surface condition of the substrate to the vapor generating bath 61. For example, the first solvent heating bath 84a is allowed to communicate with the vapor generating bath 61 if the substrate is hydrophobic while the second solvent heating bath 84b is allowed to communicate with the vapor generating bath 61 if the substrate surface is hydrophilic.

A substrate processing unit may be constructed involving a plurality of solvent heating baths 84a to 84n and if need be, an organic solvent which is heated at a temperature suitable for the surface condition of the applicable substrate can be quickly supplied to the vapor generating bath 61. The functions and effects of a substrate processing unit constructed in a way other than that set forth above are believed to be the same as those of the first embodiment and thus will no longer be explained here.

The substrate processing unit of the invention is not limited to the first and second embodiments stated hereinabove; needless to say, the invention can be modified within and without departing from the scope of the gist of the invention such that processing baths, processing fluid supply means, vapor generating bath, processed fluid discharge means, solvent heating bath as well as the initial and second temperatures can be modified. In addition, the substrate processing unit of the invention can be applied to various substrates such as, a glass substrate of a liquid crystal display unit, a storage disc such as an optical storage disc, or, a magnetic storage disc.

What is claimed is:

1. A substrate processing unit comprising:
    a processing bath for accommodating substrates to be processed;
    processing fluid supply means for supplying a processing fluid to the processing bath;
    a vapor generating bath for accommodating an organic solvent and introducing the vapor generated from the organic solvent into the processing bath;
    processing fluid discharge means for discharging the processing fluid from the processing bath; and
    a solvent heating unit for heating the organic solvent in the vapor generating bath, wherein the solvent heating unit heats the organic solvent at an initial temperature when a surface of each substrate accommodated in the processing bath is hydrophobic, and heats the organic solvent at a higher temperature when the substrate surface is hydrophilic.

2. The substrate processing unit according to claim 1, wherein the processing fluid is purified water, and the organic solvent is isopropyl alcohol.

3. The substrate processing unit according to claim 2, wherein the first temperature is in the range of 50° C.±5° C. and the second temperature is in the range of 70° C.±5° C.

4. The substrate processing unit according to any of claims 1 to 3, further comprising:
    a first solvent heating bath for accommodating an organic solvent which is heated at the initial range of temperature;
    a second solvent heating bath for accommodating therein an organic solvent which is heated at the higher range of temperature;
    a piping for connecting the first and second solvent heating baths and the vapor generating bath; and
    switching means provided on the piping for allowing the first solvent heating bath to communicate with the vapor generating bath in cases where the surface of the substrate accommodated in the processing bath is hydrophobic and for allowing the second solvent heating bath to communicate with the vapor generating bath in cases where the surface of the substrate accommodated in the processing bath is hydrophilic.

5. A substrate processing unit comprising:
    a processing bath for accommodating substrates to be processed;
    processing fluid supply means for supplying a processing fluid to the processing bath;
    a vapor generating bath for accommodating an organic solvent and introducing the vapor generated from the organic solvent into the processing bath;
    processing fluid discharge means for discharging the processing fluid from the processing bath; and
    inert gas supply means for supplying a first amount of inert gas for bubbling to the organic solvent in the vapor generating bath when a surface of the substrate accommodated in the processing bath is hydrophobic, and supplying a second amount of inert gas for bubbling to the organic solvent when the substrate surface is hydrophilic, wherein the second amount is larger than the first amount.

6. The substrate processing unit according to claim 1 or 5, further comprising chemical fluid preparation means provided in the processing fluid supply means for preparing a desired chemical fluid of a certain concentration and a given temperature.

7. The substrate processing unit according to claim 6, wherein the chemical fluid contains at least one chemical fluid which is selected from hydrofluoric acid, hydrochloric acid, hydrogen peroxide fluid, sulfuric acid, ozone water, ammonia water, alkaline detergent, surface active agent, amine organic solvent, fluorine organic solvent, electrolytic ion water.

8. The substrate processing unit according to claim 1 or 5, wherein the processing bath is provided with an inner bath capable of accommodating processing fluid and an outer bath into which the processing fluid flows from the upper portion of the inner bath, and wherein the processing fluid supply means and the processing fluid discharge means are independently provided in the inner bath at the bottom thereof and wherein a processing fluid introduction pipe is connected to the processing fluid supply means and a drain pipe is connected to the bottom of the outer bath.

9. A substrate processing unit comprising:
    a processing bath for accommodating substrates to be processed;
    processing fluid supply means for supplying a processing fluid to the processing bath;
    a vapor generating bath for accommodating an organic solvent and introducing a vapor generated from the organic solvent into the processing bath;
    processing fluid discharge means for discharging the processing fluid from the processing bath;
    a solvent heating unit for heating the organic solvent in the vapor generating bath, wherein the solvent heating unit heats the organic solvent at an initial temperature when a surface of the substrate accommodated in the processing bath is hydrophobic, and heats the organic solvent at a higher temperature which is higher than the first temperature when the substrate surface is hydrophilic; and
    inert gas supply means for supplying a first amount of inert gas for bubbling to the organic solvent in the vapor generating bath when a surface of the substrate accommodated in the processing bath is hydrophobic, and supplying a second amount of inert gas for bubbling to the organic solvent when the substrate surface is hydrophilic, wherein the second amount is larger than the first amount.

* * * * *